United States Patent [19]

Dopheide et al.

[11] Patent Number: 4,940,330

[45] Date of Patent: Jul. 10, 1990

[54] LASER DOPPLER ANEMOMETER

[75] Inventors: Dietrich Dopheide; Michael Faber; Guenter Taux, all of Braunschweig; Gerhard Reim, Rothemuehle, all of Fed. Rep. of Germany

[73] Assignee: Fed. Rep. of Germany, represented by the Federal Minister for Economics, who is in turn represented by the President of the Physical-Technical Federal Institute, Braunsweig, Fed. Rep. of Germany

[21] Appl. No.: 226,925

[22] Filed: Aug. 1, 1988

[30] Foreign Application Priority Data

Aug. 5, 1987 [DE] Fed. Rep. of Germany ....... 3725978
Oct. 30, 1987 [DE] Fed. Rep. of Germany ....... 3736772

[51] Int. Cl.$^5$ .............................................. G01P 3/36
[52] U.S. Cl. .................................... 356/28.5; 356/349
[58] Field of Search ........................... 356/5, 28.5, 349

[56] References Cited

U.S. PATENT DOCUMENTS

| | | | |
|---|---|---|---|
| 3,877,813 | 4/1975 | Hayes et al. | 356/349 |
| 4,373,807 | 2/1983 | Gouesbet | 356/28.5 |
| 4,492,464 | 1/1985 | Bourdet | 356/349 |
| 4,511,249 | 4/1985 | Frungel | 356/5 |
| 4,666,295 | 5/1987 | Devall et al. | 356/5 |

FOREIGN PATENT DOCUMENTS

| | | |
|---|---|---|
| 2430664.7 | 1/1976 | Fed. Rep. of Germany . |
| 3435423A1 | 8/1985 | Fed. Rep. of Germany . |
| 1362923 | 12/1987 | U.S.S.R. ............................... 356/349 |

OTHER PUBLICATIONS

Boutier et al, "Laser Velocimeter for Wind Tunnel Measurements", IEEE Transactions on Aerospace and Electronic Systems, vol. AES-14, No. 3, May 1978, pp. 441-454.

J. Oldengarm et al, Optics and Laser Technology, Dec. 1973, vol. 5, No. 6.

G. R. Grant et al, Applied Optics, vol. 12, No. 12, Dec. 1973.

*Primary Examiner*—Stephen C. Buczinski
*Attorney, Agent, or Firm*—Foley & Lardner, Schwartz, Jeffery, Schwaab, Mack, Blumenthal & Evans

[57] ABSTRACT

A laser Doppler anemometer includes at least a first and second laser source, an optical system for directing laser beams from the sources to a specific region of a fluid flow containing particles in order to produce a virtual interference fringe pattern and at least one photodetecter positioned for receiving the scattered light from the flowing fluid. At least one of a temperature regulation and current regulation circuit is provided for stabilizing the wavelength of at least one of the laser sources. The first and second laser sources are set to different emission wavelengths and a regulating circuit is provided for maintaining the difference frequency between the first and second sources constant. The difference frequency is in turn utilized to control the temperature regulation and/or current regulation circuit for at least one of the laser sources to achieve stabilized operation thereof.

5 Claims, 2 Drawing Sheets

LASER DOPPLER ANEMOMETER

Background of the Invention

The invention relates to a laser Doppler anemometer having two laser diodes, the laser beams of which are concentrated in a specific region of a fluid flow containing particles, so that a virtual interference fringe pattern is formed in this region. The anemometer has at least one photodetector for the detection of light scattered by the flowing fluid, the wavelength of the laser diodes being set and stabilized by a temperature regulation and current regulation.

A laser Doppler anemometer of the above type is known from DE-OS 3,435,423. The use of laser diodes as laser light sources has, on the one hand, the advantage that a compact and cheap construction of the anemometer is possible, and on the other hand, the emission wavelength of the laser diode may be set by altering the constant current with which the laser diode is operated and/or altering the temperature of the laser diode. In the known technique, two partial beams of the same laser diode are superposed in the region of the flowing fluid which is to be investigated, so that a virtual interference fringe pattern is formed. As a result of the wavelength stabilization, the interference fringe pattern is stable and stationary, with a sufficient coherence length of the laser radiation. The spacing of the intensity maxima in the interference fringe pattern is dependent upon the laser frequency and the angle of intersection between the two laser beams. The particles of the flowing fluid which pass through the interference fringe pattern emit a scattered light, the frequency of which is shifted by the Doppler frequency in relation to the frequency of the laser beam. The determination of the Doppler frequency permits the determination of the flow speed. The determination of the flow speed in this manner comes up against difficulties if highly turbulent flows as well as flows with separations are investigated and if the flow speed is very low.

DE-OS 2,430,664 discloses a laser Doppler anemometer in which two laser beams with differing frequencies are superposed, so that the interference pattern moves at a defined speed. In this case, it is assumed that He-Ne lasers are employed, but the use of mercury vapor lamps or the like is considered to be possible. As a result of the movement of the interference field, it is possible to measure the actual measurement quantity, namely the Doppler frequency, using simple means.

Summary of the Invention

An object of the invention is to produce a laser Doppler anemometer of the initially mentioned type in such a manner that it permits the measurement of the flow speed in a reliable manner, even in the case of flow speeds with alternating signs, for example highly turbulent flows, flows with separations and low flow speeds.

With a laser Doppler anemometer of the initially mentioned type, this object is achieved, according to the invention, in that the two laser diodes are set to differing emission wavelengths (emission frequencies) and in that a regulating circuit is provided to maintain constant the difference frequency which acts on the temperature regulation and/or current regulation of at least one of the laser diodes.

As a result of setting the lasers to operate at different emission wavelengths, a virtual interference fringe pattern is formed in the volume of intersection of the laser beams. This pattern, however, no longer stands still, but moves with a speed corresponding to the difference frequency or beat frequency. Hitherto, such moving interference fringe patterns were generated by using acousto-optical modulators and rotating gratings. In this case, a disadvantage is the restriction to a fixed difference frequency in the case of the acousto-optical modulator. In the case of the rotating grating, the frequency shift is too small in many practical cases. Over and above this, light losses are created by diffraction phenomena. The invention is based on the finding that a moving interference band system can be generated without the above-mentioned disadvantages by two laser diodes, the wavelength of which is tunable.

It is clear, without further ado, that a broad range of difference frequencies can be set with the arrangement according to the invention; in this case, the respective difference frequency is kept constant by the regulating circuit.

By means of the use, according to the invention, of laser diodes LD1 and LD2 with differing emission wavelengths, the field of application of laser diode anemometers is thus considerably expanded, so that additional possibilities for investigation are opened up. In this case, the laser diodes can, in principle, operate in the continuous or in the pulsed mode. However, application in the continuous mode is preferred.

The use of two separate laser diodes gives the additional advantage that a higher laser power is available in the measurement volume, so that a favorable signal-to-noise ratio can be achieved.

In the actual measurement signal, which is formed by the scattered light and which is detected by the photodetector, the Doppler frequency containing the information of interest concerning the fluid speed is superposed by the difference frequency (shift frequency). The evaluation of this measurement signal thus requires a certain expenditure. Furthermore, the evaluation will, in general, assume that the laser beams of the laser diode frequency are stabilized, so that the expenditure associated with regulation for the stabilization of the laser beams of the laser diodes is not inconsiderable.

A simple evaluation of the measurement signal is possible, even where the stabilization of the laser beam frequencies of the laser diodes is less precise, if a signal corresponding to the difference frequency is mixed with a signal corresponding to the scattered light, so that the Doppler frequency is directly available after filtering.

Brief Description of the Drawings

The invention is to be explained in greater detail herein below with reference to illustrative embodiments represented in the drawings. In the drawings.

Detailed Description of the Preferred Embodiment

Figure 1:
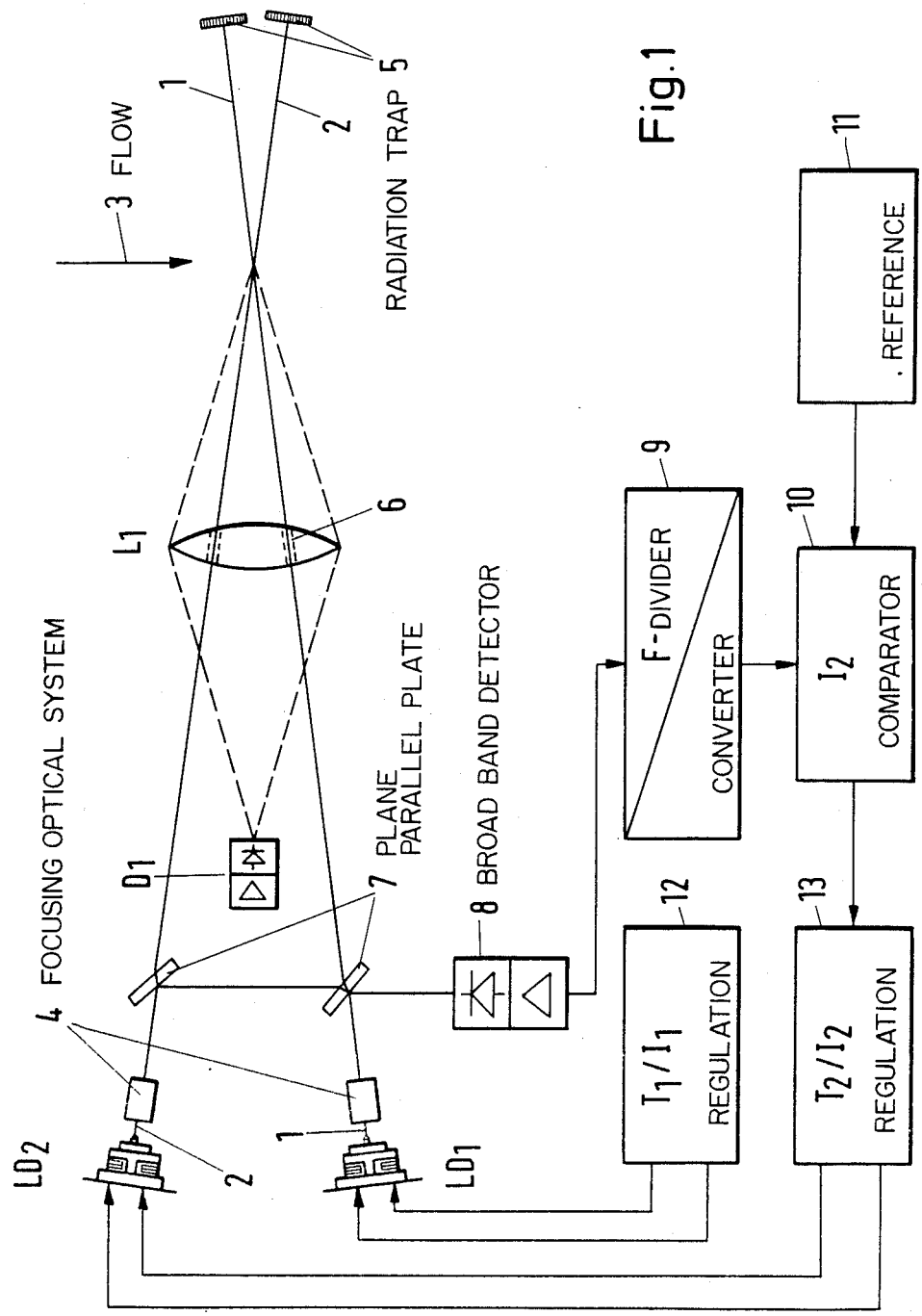
FIG. 1 is a diagram of a representation of a laser Doppler anemometer according to the invention, with an electrical evaluation circuit.

In the illustrative embodiment represented in FIG. 1, two laser diodes LD1 and LD2 are aligned so that their beams 2 are superposed in the measurement volume in the flow 3 of a fluid, and form a virtual interference fringe pattern. The two laser beams 1, 2 each pass through a respective focusing optical system 4, which ensures that the laser beams 1, 2 are in each instance focused in the measurement volume. After passing through the measurement volume, the two laser beams 1, 2 are absorbed in a radiation trap 5, so that they do not disturb further measurement.

In the illustrative embodiment represented in FIG. 1, the light scattered backwards from the measurement volume is focused by a focusing lens L1 onto the input of a photodetector D1. The photodetector D1 converts the optical signal into an electrical signal, which is evaluated in the known manner with respect to the Doppler frequency—and thus to the flow speed of the flow 3 of the fluid. The focusing lens L1 exhibits passage openings 6 for the laser beams 1, 2 so that these are not influenced by the focusing lens L1.

Between the focusing optical system 4 and the focusing lens L1, partial beams are coupled out from the laser beams 1, 2 by means of plane-parallel plates 7, so that the coupled-out beams pass, impinging on one another, to the input of a broad-band detector 8. The broad-band detector 8 converts the optical signal at its input into an electrical signal. In order to determine the difference frequency of the two laser beams 1, 2, a signal processing unit 9 is connected to the broad-band detector, which unit consists of a frequency divider and a frequency-voltage converter. At the output of the signal processing unit 9—and thus at an input of a downstream comparator 10—there is therefore a voltage proportional to the difference frequency between the two laser beams 1, 2. A reference voltage set by a reference voltage source 11 passes to a second input of the comparator 10.

The two laser diodes LDI and LD2 are connected, in a manner known per se, to a respective regulating network 12, 13, with which the current I1 and I2 respectively flowing through the laser diodes LD1 and LD2 respectively is set and maintained constant and the operating temperature T1 and T2 respectively of the laser diodes LD1 and LD2 respectively is likewise maintained constant.

In the present case, the comparator (regulator) 10 is designed so that it permits a control of the constant current I2 of the laser diode LD2 if the difference frequency, measured by the broad-band detector 8, between the two laser beams 1, 2 deviates from the theoretical frequency set by means of the reference voltage source 11.

Figure 2:
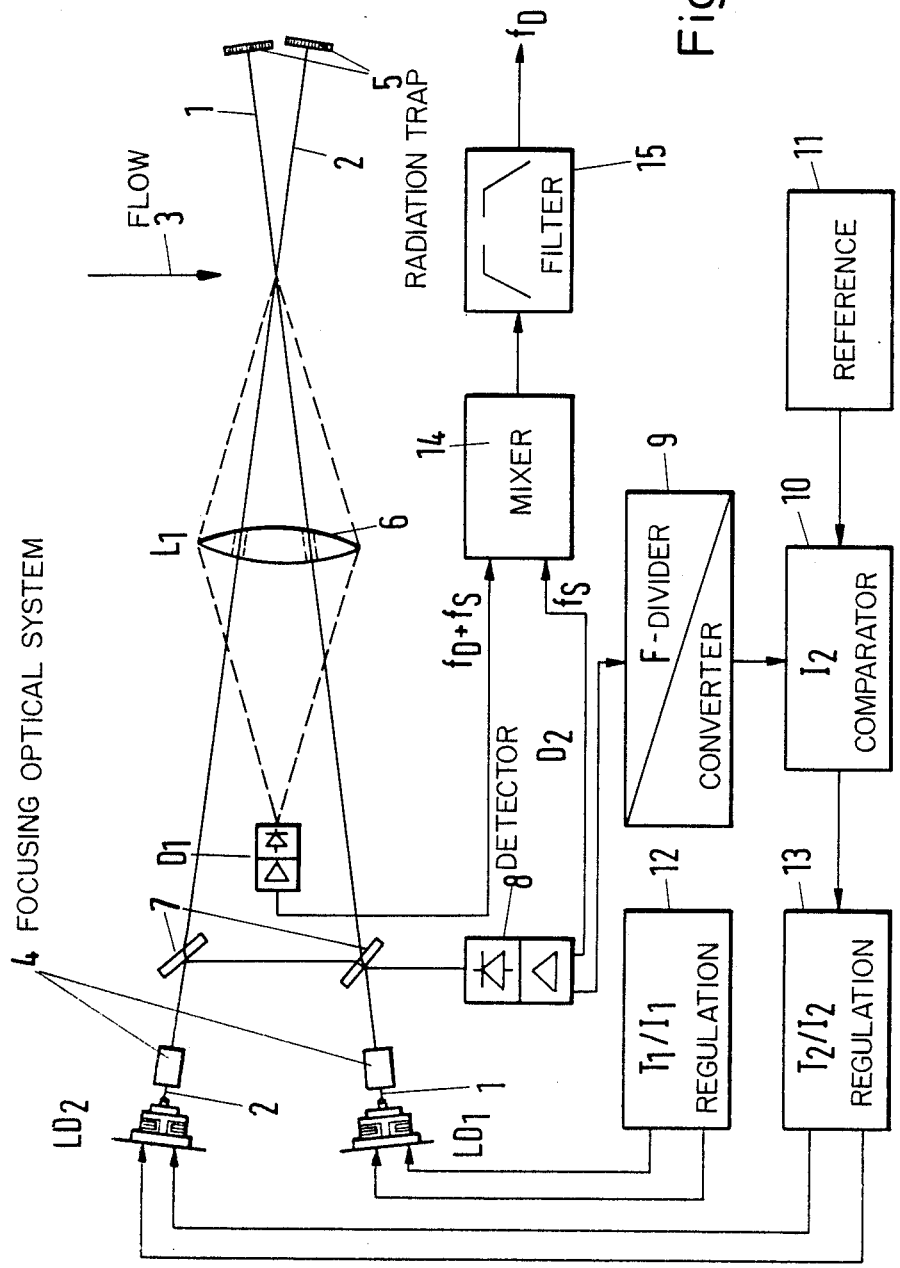
FIG. 2 shows a device according to FIG. 1, with a mixing device for the purpose of the evaluation.

The output signal of the photodetector D1 contains the superposed Doppler frequency fD and the difference frequency (shift frequency) fs. In the illustrative embodiment represented in FIG. 2, this signal passes to an input of a mixer 14, to the other input of which the output signal of the broad-band detector D2 8 passes. The signal (fD+fs)−fs=fD is present, inter alia, at the output of the mixer as a mixing product, so that the Doppler frequency fD containing the measurement information concerning the flow speed is directly available by means of a downstream filter 15. Frequency changes of the difference frequency fs during the "transit time" of the particles are eliminated to the greatest possible extent by the mixing process.

Accordingly, the field of application of laser diode anemometers is considerably expanded by the use, according to the invention of laser diodes LD1 and LD2 with differing emission wavelengths, so that additional possibilities for investigation are opened up. In this case, the laser diodes can, in principle, operate in the continuous or in the pulsed mode. However, application in the continuous mode is preferred.

What is claimed is:

1. A laser Doppler anemometer comprising:
   at least a first and second laser source, each said source including a laser diode set to a different emission wavelength, for producing first and second laser beams, respectively;
   means for directing said laser beams from said sources to a specific region of a flowing fluid containing particles, so that a virtual interference fringe pattern is formed in said region;
   at least one photodetector positioned for receiving light scattered by said flowing fluid;
   at least one of a temperature regulation and a current regulation circuit for stabilizing the wavelength of at least one of said laser beams from at least one of said first and second sources; and
   regulation circuit means for maintaining constant the difference frequency between said first and second laser sources, said difference frequency controlling said at least one of said temperature regulation or said current regulation circuit, said regulation circuit means including a measuring photodetector.

2. The laser Doppler anemometer as claimed in claim 1, further including a comparator for receiving a measurement signal corresponding to said difference frequency and a reference signal corresponding to a desired difference frequency.

3. The laser Doppler anemometer as claimed in claim 1, further comprising a mixer for combining a signal corresponding to the difference frequency ($f_s$) with a signal ($f_s+f_D$) from said at least one photodetector corresponding to the scattered light, and a filter connected to the output of said mixer for producing a Doppler frequency ($f_D$).

4. The laser Doppler anemometer as claimed in claim 3, wherein said anemometer further comprises optical directing means for directing a portion of each of such laser beams to said measuring photodetector for producing said difference frequency ($f_s$) signal.

5. The laser Doppler anemometer as claimed in claim 1, wherein said anemometer further includes a temperature regulation and current regulation circuit for each of said laser sources and wherein said regulation circuit means includes means for maintaining constant said difference frequency for controlling each of said first and second laser sources.

* * * * *